US005984731A

United States Patent [19]
Laity

[11] Patent Number: 5,984,731
[45] Date of Patent: Nov. 16, 1999

[54] REMOVABLE I/O DEVICE WITH INTEGRATED RECEPTACLES FOR RECEIVING STANDARD PLUGS

[75] Inventor: Ian A. Laity, Simi Valley, Calif.

[73] Assignee: Xircom, Inc., Thousand Oaks, Calif.

[21] Appl. No.: 08/971,501

[22] Filed: Nov. 17, 1997

[51] Int. Cl.⁶ .................................................. H01R 23/02
[52] U.S. Cl. .................... 439/676; 439/76.1; 439/638; 439/946; 361/686; 361/737
[58] Field of Search .................... 439/676, 76.1, 439/638, 946, 946.2; 361/737, 686, 785

[56] References Cited

U.S. PATENT DOCUMENTS

| | | | |
|---|---|---|---|
| 4,103,985 | 8/1978 | Krolak et al. | 339/126 R |
| 4,242,721 | 12/1980 | Krolak et al. | 361/415 |
| 4,303,296 | 12/1981 | Spaulding | 339/122 R |
| 5,183,404 | 2/1993 | Aldous et al. | 439/55 |
| 5,244,397 | 9/1993 | Anhalt | 439/101 |
| 5,336,099 | 8/1994 | Aldous et al. | 439/131 |
| 5,338,210 | 8/1994 | Beckham et al. | 439/131 |
| 5,386,340 | 1/1995 | Kurz | 361/737 |
| 5,391,083 | 2/1995 | Roebuck et al. | 439/76 |
| 5,391,094 | 2/1995 | Kakinoki et al. | 439/638 |
| 5,395,268 | 3/1995 | Okada | 439/676 |
| 5,411,405 | 5/1995 | McDaniels et al. | 439/131 |
| 5,457,601 | 10/1995 | Georgopulos et al. | 361/686 |
| 5,477,418 | 12/1995 | MacGregor et al. | 361/737 |
| 5,499,923 | 3/1996 | Archibald et al. | 439/26 |
| 5,505,628 | 4/1996 | Ramey et al. | 439/76.1 |
| 5,505,633 | 4/1996 | Broadbent | 439/329 |
| 5,509,811 | 4/1996 | Homic | 439/55 |
| 5,532,898 | 7/1996 | Price | 361/119 |
| 5,538,442 | 7/1996 | Okada | 439/676 |
| 5,547,401 | 8/1996 | Aldous et al. | 439/676 |
| 5,548,483 | 8/1996 | Feldman | 361/737 |
| 5,561,727 | 10/1996 | Akita et al. | 385/88 |
| 5,562,463 | 10/1996 | Tan | 439/76.1 |
| 5,562,501 | 10/1996 | Moshayedi | 439/638 |
| 5,608,606 | 3/1997 | Blaney | 361/686 |
| 5,608,607 | 3/1997 | Dittmer | 361/686 |
| 5,611,055 | 3/1997 | Krishan et al. | 395/281 |
| 5,619,396 | 4/1997 | Gee et al. | 361/686 |
| 5,628,055 | 5/1997 | Stein | 455/89 |
| 5,634,802 | 6/1997 | Kerklaan | 439/131 |
| 5,637,018 | 6/1997 | Gargiulo | 439/640 |
| 5,702,271 | 12/1997 | Steinman | 439/676 |
| 5,773,332 | 6/1998 | Glad | 439/946 |
| 5,775,946 | 7/1998 | Briones | 439/676 |

FOREIGN PATENT DOCUMENTS

| | | |
|---|---|---|
| 2101354 | 1/1994 | Canada . |
| 29607724 | 8/1996 | Germany . |
| 197652 | 6/1989 | Japan . |
| 8162233 | 6/1996 | Japan . |
| WO9513633 | 5/1995 | WIPO . |

OTHER PUBLICATIONS

Duel Systems Drawing No. 31068–05, Rev. 2, entitled "Type III–68 Pin Connector, RJ 11 And RJ 48, 6 And 8 Positions" (3 Sheets).

*Primary Examiner*—Paula Bradley
*Assistant Examiner*—Tho D. Ta
*Attorney, Agent, or Firm*—Loeb & Loeb LLP

[57] ABSTRACT

A Type III PCMCIA communications card for insertion in a slot in a host computer comprises a housing including a top wall and longitudinal, parallel side walls depending from the top wall, the longitudinal side walls and top wall defining an internal cavity enclosed by a bottom cover panel. The housing further has a forward end, a rear margin and a rear end surface, the rear margin of the housing defining at least one substantially longitudinally oriented receptacle extending forwardly from the rear end surface and sized and configured to receive a standard RJ-type modular plug. A substrate, mounted within the cavity of the housing, supports electronic components for carrying out the communications function. The substrate has a rear margin carrying a contact block including a plurality of contact wires, each contact wire having a first portion connected to components on the substrate, and a second portion extending into the at least one receptacle, the second portion of the contact wire being shaped and positioned for engagement with a corresponding contact on the connector plug. A connector provided at the forward end of the housing is adapted to be received by a corresponding connector within the slot of the host computer.

15 Claims, 14 Drawing Sheets

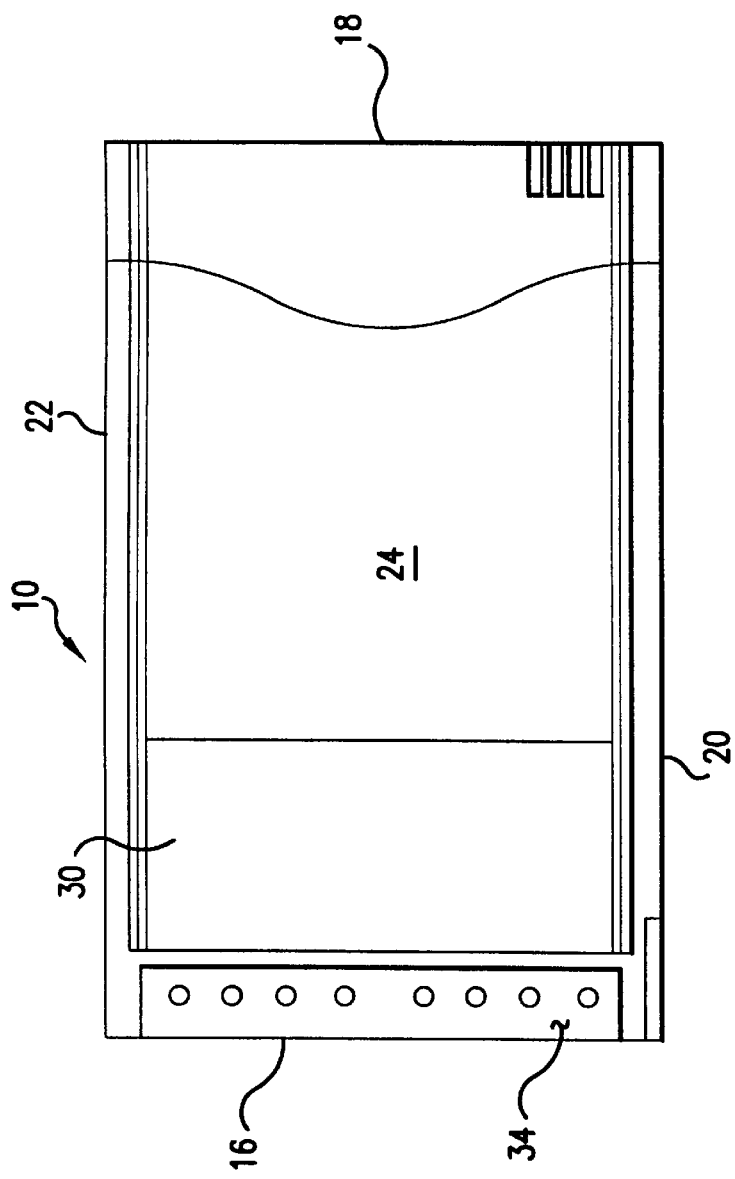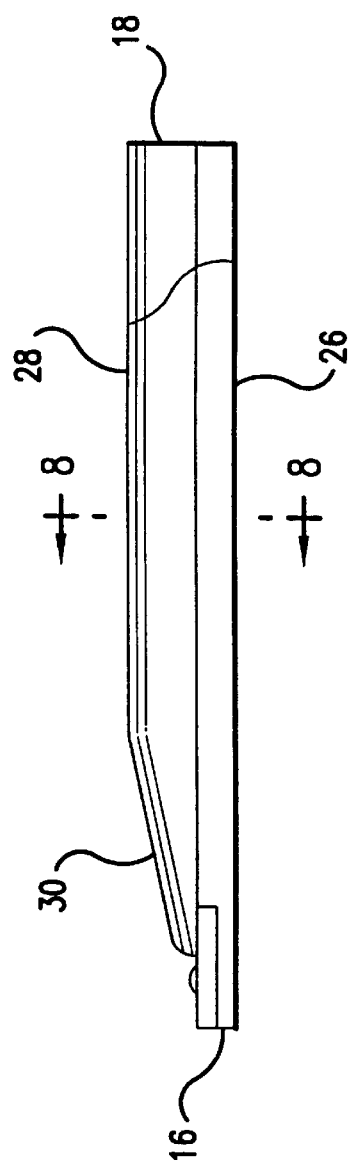
FIG.2
FIG.3

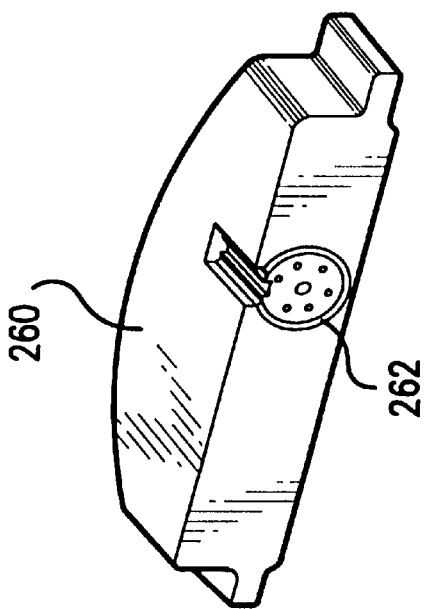
FIG.16
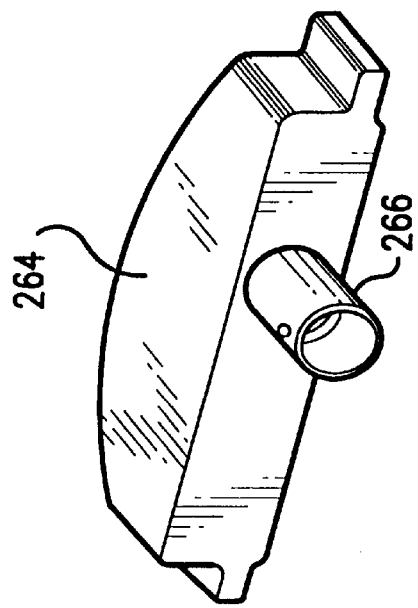
FIG.17
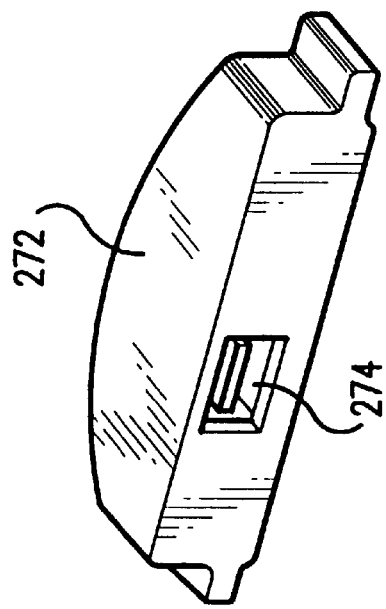
FIG.18
FIG.19

REMOVABLE I/O DEVICE WITH INTEGRATED RECEPTACLES FOR RECEIVING STANDARD PLUGS

FIELD OF THE INVENTION

This invention relates generally to removable input/output (I/O) devices of the type used with host systems such as desktop and portable personal computers, peripherals, and the like, for connecting the host system to an information transfer system.

BACKGROUND OF THE INVENTION

As is well known, many of today's laptop, notebook, desktop and other computers, as well as computer peripherals and other electronic products, are designed to receive removable devices such as cards conforming to standards established by the Personal Computer Memory Card International Association (PCMCIA). These standards define the electrical and physical specifications of the card including the interfaces between the card and the port or slot into which the card is inserted. The specifications include a 16-bit PC Card interface and a 32-bit CardBus interface. The PCMCIA standards also specify three card form factors, called Type I, Type II and Type III. All three card types measure the same length (85.6 mm) and the same width (54.0 mm), and differ only in overall thickness. Thus, the Type I card has a thickness of 3.3 mm; the Type II card, 5.0 mm; and the Type III card, 10.5 mm. PCMCIA cards may be used for various purposes. For example, Type I cards are typically used for memory devices; Type II cards are typically used for I/O devices, as will be described below; and Type III cards are typically used to house rotating mass storage devices (disk drives). Presently, Type II cards are used principally as communication links, for example, for connecting the user of a host system such as a portable computer to an Ethernet LAN, as a data/fax modem for connecting the user to a subscriber telephone line system, or as a combined LAN and modem card. In one popular arrangement, an adapter cable is used to couple the relatively thin Type II card to the much larger, standard RJ-11 or RJ-45 receptacle of a telephone line or Ethernet network. A drawback of this arrangement is that one or more bulky adapter cables must be carried (in addition to the computer) by the computer user in order to connect the computer to a LAN or telephone line system thereby defeating at least to some extent the advantages afforded by portable computers; also, these adapter cables are often lost. Another disadvantage of adapter cables is that the connection between the thin card and the cable is inherently fragile mechanically and subject to losses of electrical contact with a consequent loss of data transfer.

One solution to the problem of incompatibility between the PCMCIA Type II standard communications card and the RJ-type connector is to add to the rear end of the Type II card an enlarged housing enclosing a receptacle sized and configured to receive an RJ-type connector plug. The incorporation of such an RJ receptacle housing allows the 5 mm Type II communications card to interface directly with a LAN or telephone system using an existing LAN or telephone cable with an RJ-11 or RJ-45 modular plug at each end. However, although this approach eliminates the need for a separate adapter cable assembly, the housing on the end of the card for receiving the RJ-type connector projects from the host system enclosure often requiring the removal of the card when transporting a portable computer in an attache case or the like.

Another approach to the elimination of the need for external adapter cables is a communications card that allows an RJ-type modular plug to be inserted directly into an aperture formed in a retractable access portion of a Type II communications card. Such an approach is disclosed, for example, in U.S. Pat. No. 5,183,404 issued Feb. 2, 1993. Yet another approach to eliminating the need for adapter cables is disclosed in International Application No. PCT/US94/13106, published May 18, 1995 under the Patent Cooperation Treaty (PCT) as Publication No. WO 95/13633 (corresponding to U.S. Pat. No. 5,773,332). FIG. 21 of this PCT publication shows a Type III card incorporating in the rear thereof a pair of RJ-xx series receptacles (specifically RJ-11 and RJ-45) for directly connecting the card to a LAN network and/or telephone line.

An overall object of the present invention is to provide an improvement of the device disclosed in the aforementioned PCT publication.

SUMMARY OF THE INVENTION

In accordance with one specific, exemplary embodiment of the invention, there is provided a device adapted to be received by a port in a host system for connecting the host system to a digital information transfer system. The device comprises a housing having longitudinal sides, a transverse front end and a rear portion, at least the rear portion of the housing conforming substantially to the PCMCIA Type III thickness standard. A substrate enclosed within the housing carries circuit elements and a connector at the front end of the housing is connected to circuit elements on the substrate. The connector is adapted to be received by a corresponding connector within the slot of the host system. The rear portion of the housing defines at least one forwardly extending receptacle, the at least one receptacle including contact wires coupled to circuit elements on the substrate. The at least one receptacle is sized and configured to receive a standard connector plug, the plug including contacts adapted to engage the contact wires in the at least one receptacle when the plug is inserted in the receptacle so that the device is adapted to be directly connectable to the digital information transfer system utilizing the standard connector plug. The receptacle may be oriented and the rear portion of the housing so constructed to receive the standard connector plug in a substantially longitudinal insertion direction, and the at least one receptacle may be adapted to receive an RJ-xx type modular communications plug, such as an RJ-11 or RJ-45 plug. The substrate includes a rear margin carrying a contact block having a plurality of contact wires. Each contact wire has a first portion, or solder tail, connected to circuit elements on the substrate, and a second portion extending into the at least one receptacle, the second portion of the contact wire being shaped and positioned for engagement with a corresponding contact on the connector plug. More specifically, the second portion of each contact wire includes an end and the at least one receptacle has a top wall having an interior surface having a plurality of longitudinally extending grooves, each groove receiving the end of one of the contact wires. Still further, the contact block includes a plurality of longitudinally extending slots, each slot being in longitudinal alignment with a corresponding groove in the interior surface of the top wall of the at least one receptacle, the second portion of each contact wire being retained within one of the slots. The contact block further defines a recess overlying the rear margin of the substrate, at least part of the first portion, or solder tail, of each contact wire being disposed within the confines of the recess.

The contact block is designed to minimize its encroachment on the adjacent printed circuit board assembly (PCBA). Thus, the forwardly extending solder tail of each contact wire is contained substantially within the longitudinal confines of the recess and is connected to the traces on the rear margin of the PCBA as close as practicable to the rear edge of the PCBA. After fabrication of the subassembly comprising the PCBA and contact block, the recesses defined by the contact block facilitate inspection of the integrity of the solder joints connecting the contact wire tails to the PCBA and provide sufficient space to permit resoldering if necessary.

In accordance with another aspect of the present invention, there is provided an improved enclosure for an I/O device adapted to be received by a port in a host system. The improved enclosure comprises a housing including a top wall and longitudinal, parallel side walls depending from the top wall, the longitudinal side walls and top wall defining an internal cavity for receiving a substrate carrying electronic components. The housing further has a forward end, a rear portion and a rear end surface, the rear portion defining at least one receptacle extending forwardly from the rear end surface and sized and configured to closely receive a standard RJ-type modular plug. At least the rear portion of the housing conforms substantially to the PCMCIA Type III thickness standard. A bottom cover panel encloses the cavity, the bottom cover panel including parallel, upwardly extending side flanges configured to nest within the side walls of the housing. In accordance with another feature of the improved I/O device enclosure, the side walls of the housing and the upwardly extending side flanges of the bottom cover panel are adapted to receive and retain longitudinal side margins of the substrate. The housing and bottom cover panel thereby define an enclosure maximizing the usable PCBA surface area. Still further, the housing may comprise a one-piece, unitary molded plastic structure. Alternatively, to facilitate fabrication of the enclosure, the rear portion of the housing may constitute a receptacle body defining the at least one receptacle, the receptacle body and the remainder of the housing comprising separate, molded plastic structures bonded, by sonic welding, for example, along mating joinder surfaces.

BRIEF DESCRIPTION OF THE DRAWINGS

Further objects, features and advantages of the invention will become evident from the detailed description below when read in conjunction with the accompanying drawings in which:

FIG. 2 is a top plan view of the device shown in FIG. 1;

FIG. 3 is a side elevation view of the device shown in FIG. 1;

FIGS. 16–19 are perspective views of receptacle bodies in accordance with alternative embodiments of the invention.

DETAILED DESCRIPTION OF THE PREFERRED EMBODIMENTS

Figure 1:
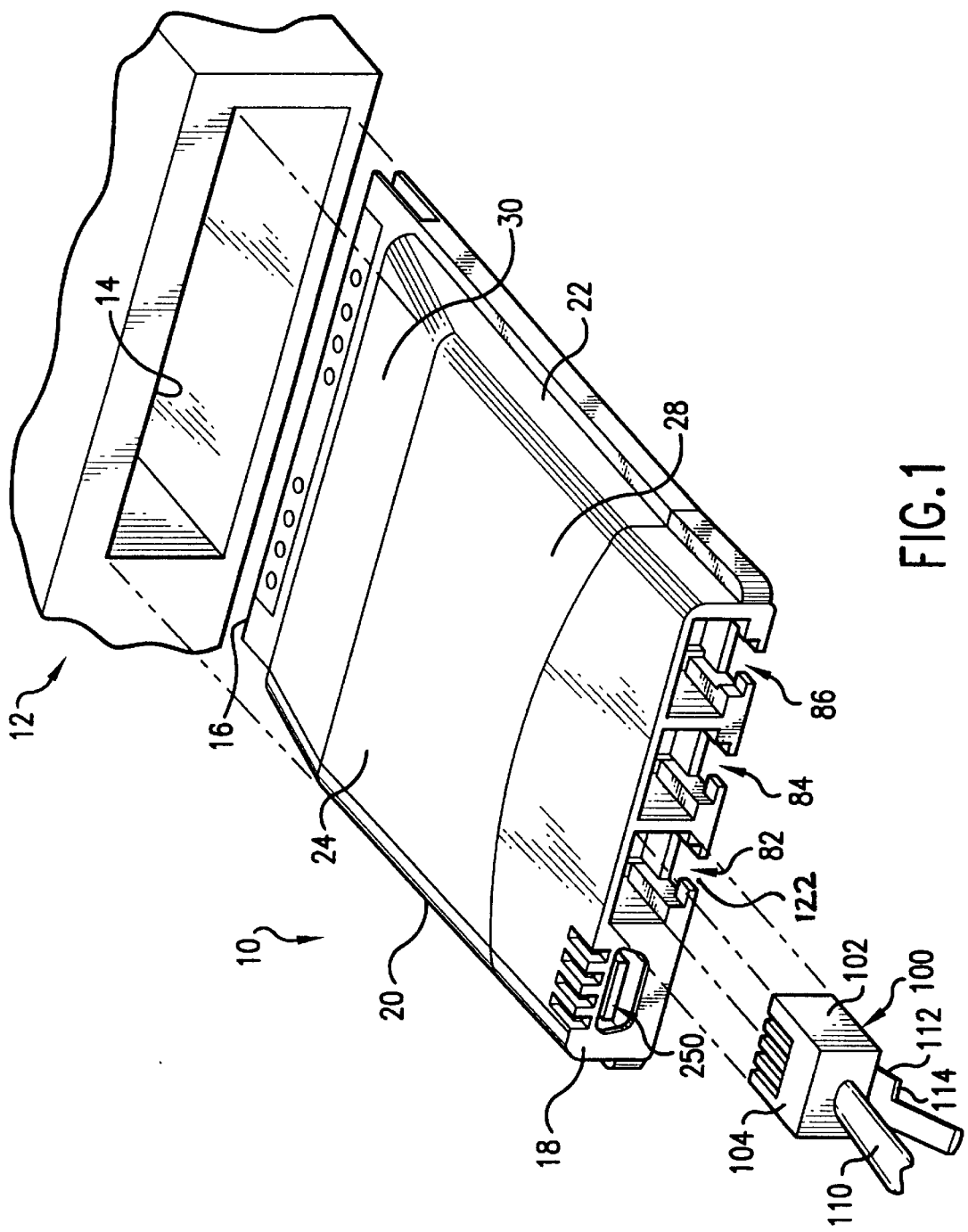
FIG. 1 is a perspective view of a device in accordance with the present invention for connecting a host system and an information transfer system, at least the rear portion of the device substantially conforming to the Type III PCMCIA thickness standard and incorporating receptacles for receiving standard connector plugs of the RJ and "slim D-sub" types.
Figure 4:
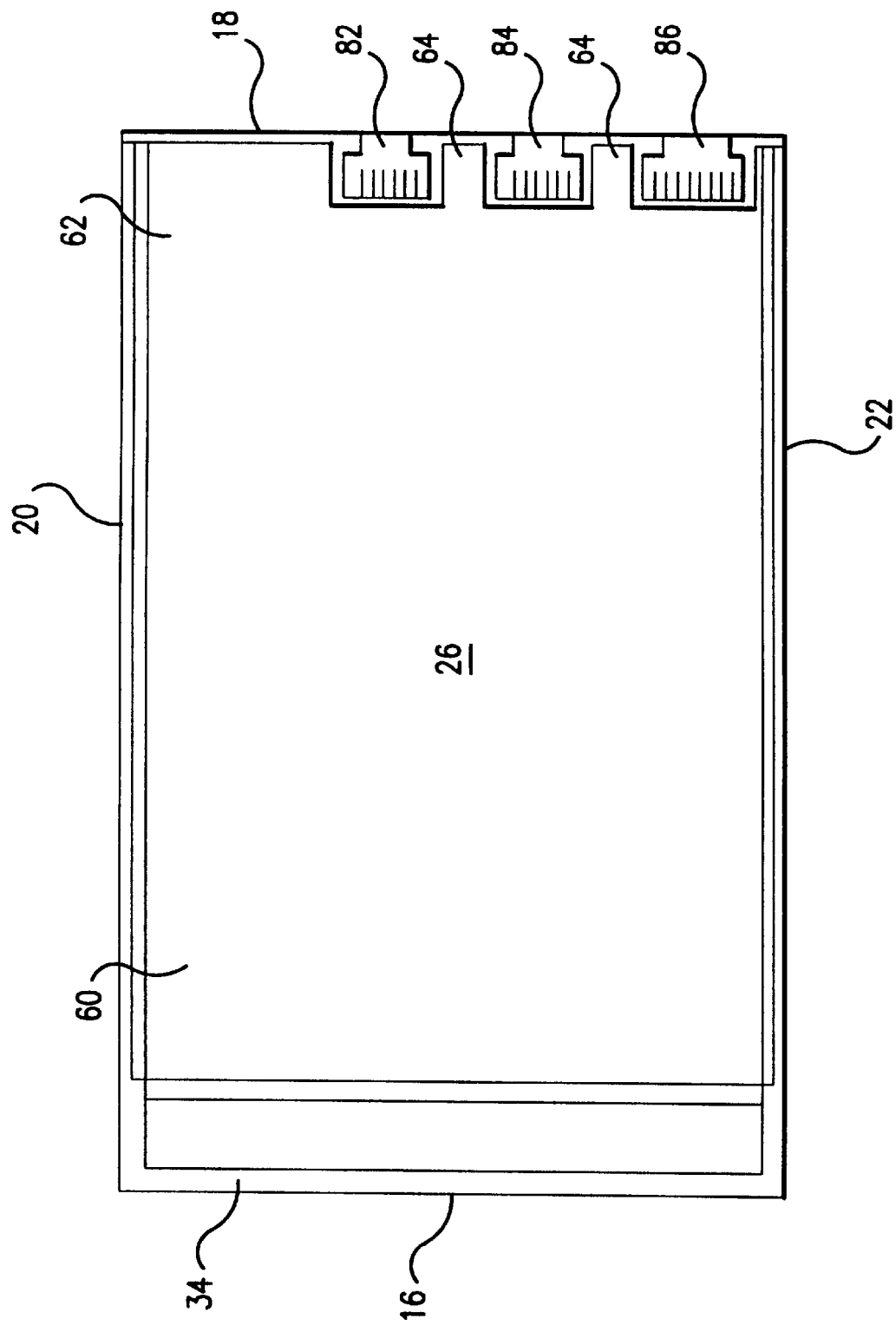
FIG. 4 is a bottom plan view of the device shown in FIG. 1.
Figure 5:
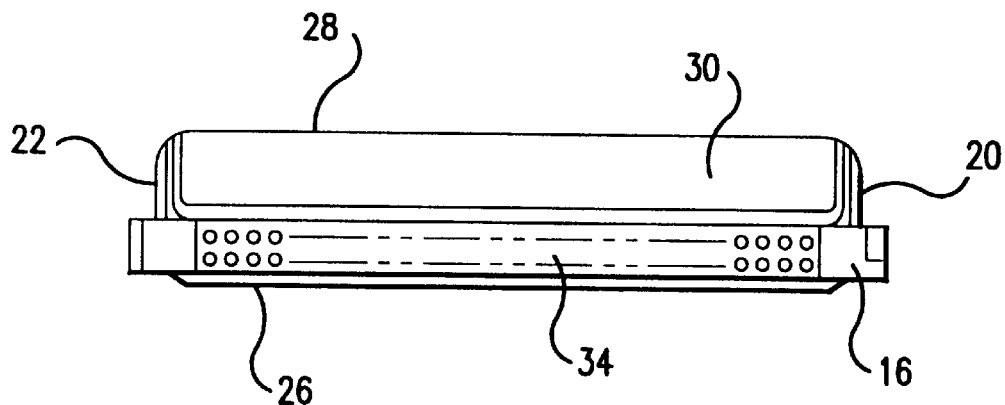
FIG. 5 is a front elevation view of the device shown in FIG. 1.
Figure 6:
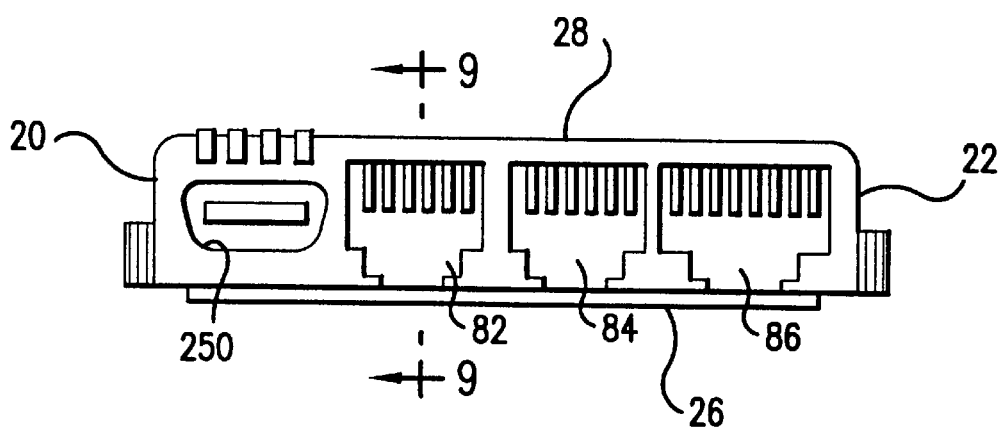
FIG. 6 is a rear elevation view of the device shown in FIG. 1.

It should be noted that terms such as "top", "bottom", "upper", "lower", "vertical", "horizontal", and the like, are used herein only to facilitate the description of the structure of the card illustrated; it will be evident that the card may be used in any orientation.

Although it will be evident to those skilled in the art that the removable I/O device of the present invention has broad utility, being usable with a wide variety of standard connector systems including both communication connector systems (for example, telephone and LAN) and non-communication connector systems (for example, video, coax, BNC, and so forth), the description of the invention will focus primarily on removable PCMCIA communication cards connectable to RJ-type standard modular connectors as a specific, exemplary context for the invention. By "RJ-type" standard modular connectors is meant RJ-11, RJ-45, and like modular connectors used, for example, for telephone line and LAN operations.

Referring to FIGS. 1–6, there is shown a preferred embodiment of the present invention comprising a PCMCIA card 10, conforming to the PCMCIA interface standard, and combining the functions of an Ethernet LAN adapter and a telephone line modem. The card 10 also supports various cellular wireless communication standards as will be described below. There is also shown (in FIG. 1) a host system 12, such as a desktop or portable computer, or computer peripheral, having a PCMCIA card port 14 for receiving the card 10.

The card 10 includes opposed, parallel, forward and rear ends 16 and 18, respectively, and parallel, longitudinal sides 20 and 22. The card 10 further has a top exterior surface 24 and a bottom exterior surface 26. The top surface 24 has a planar rear surface portion 28 parallel with the bottom surface 26 and a sloping or curved forward portion 30. It will be evident that the forward portion 30 of the top exterior surface 24 need not be sloped or curved; the entire top surface 24 of the card may simply comprise a flat surface extending forwardly from and coplanar with the planar rear surface portion 28.

In accordance with the physical standards established for all PCMCIA cards, the card 10 has a length of about 85.6 mm and a width of about 54.0 mm. The parallel top and bottom exterior surfaces 28 and 26 define an overall card thickness of about 10.5 mm in accordance with the Type III PCMCIA card form factor. In the specific embodiment under consideration, the forward end 16 of the card may have a thickness of about 5 mm matching that of a Type II card. (As is known, a Type III card port (such as the port 14) can accommodate two stacked Type II cards.)

Figure 7:
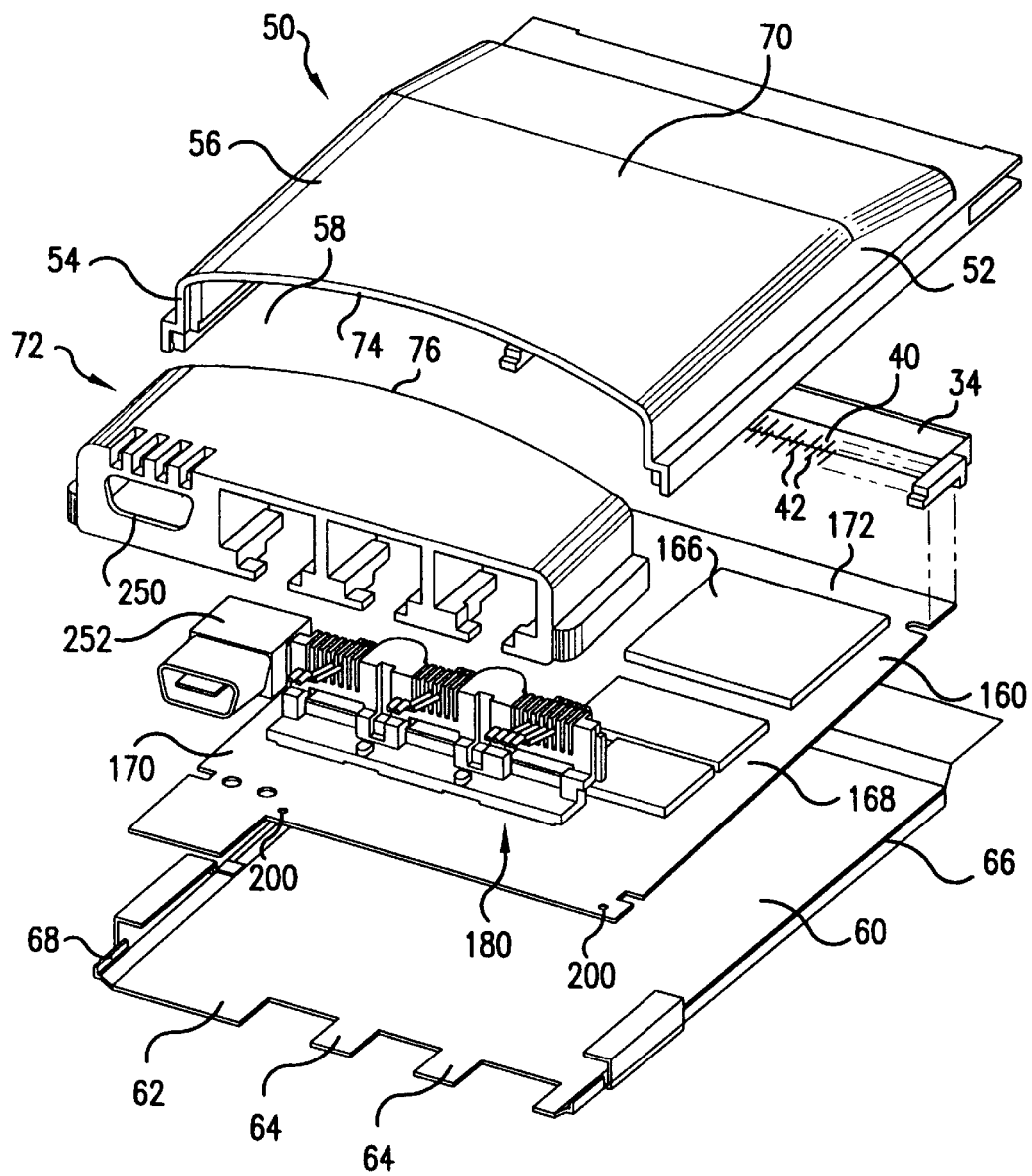
FIG. 7 is an exploded, perspective view of the device of FIG. 1 showing the major components thereof.

Disposed along the forward end 16 of the card 10 is a multicontact connector 34 designed to be removably coupled to a corresponding multipin connector (not shown) within the slot 14 in the host system 12. The connector 34 is made of molded plastic and, in accordance with the PCMCIA standard, includes sixty eight (68) contacts arranged in two rows of thirty four (34) contacts each. The connector contact and pin assignments are established by the PCMCIA interface standard. The connector 34 further includes a rear transverse face 40 from which contact leads 42 project (FIG. 7).

Figure 8:
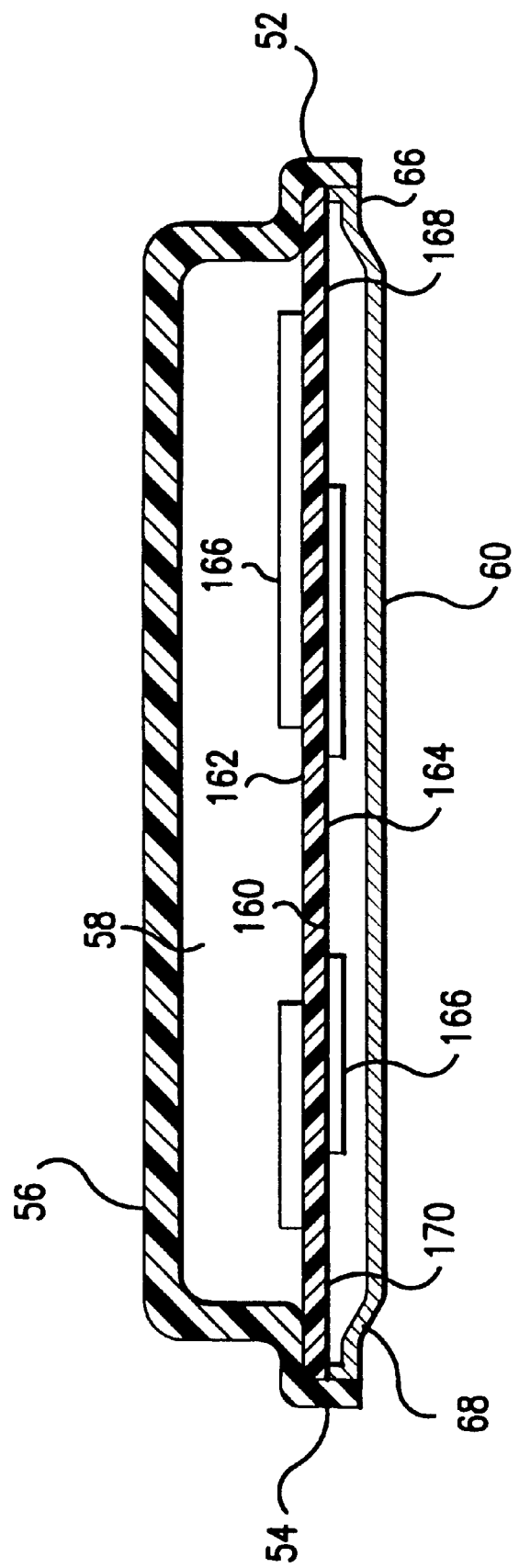
FIG. 8 is a transverse, cross section view of the device of the present invention, as seen along the line 8—8 in FIG. 3.

Referring now also to FIGS. 7–15, the card 10 is basically defined by a molded plastic housing 50 including longitudinal side walls 52 and 54 depending from a top wall 56. The walls 52, 54 and 56 define a central cavity 58 enclosed by a bottom sheet metal cover panel 60 having a rear margin 62 configured to define a pair of tabs 64, and upwardly extending side flanges 66 and 68 nested within the side walls 52 and 54 of the plastic housing 50 (FIG. 8).

In accordance with a preferred form of the invention, the housing 50 includes a front, molded plastic main housing part 70 and a separately molded, rear plastic receptacle body 72. The main housing part 70 and receptacle body 72 are permanently bonded, for example, by an adhesive or by sonic welding, along matching, arcuate joinder surfaces 74 and 76. The separate molding of the main housing part 70 and the receptacle body 72 facilitates manufacture, but it will be evident that alternatively, the housing part 70 and receptacle body 72 may be comolded, that is, molded as one piece to form a unitary housing 50.

The receptacle body 72, in the embodiment illustrated, includes four (4) sections 80, 82, 84 and 86 defined by longitudinally extending vertical walls 88, 90, 92, 94 and 96 and top wall 98. Sections 82, 84 and 86 comprise receptacles sized, configured and oriented to closely receive standard RJ-type modular connector plugs in a generally longitudinal insertion direction. Thus, by way of example and not limitation, each receptacle 82 and 84 is designed to receive a standard RJ-11 modular plug for direct connection to a telephone line for data/fax modem transmissions while the receptacle 86 is designed to receive a standard RJ-45 modular plug for direct connection to a LAN system. Although the RJ-45 plug is wider than the RJ-11 plug, the heights of these standard plugs are identical. The receptacle 84 can directly receive the RJ-11 plug on the end of an existing telephone line cable while the receptacle 82 can function as a passthrough and thus can be used, optionally, for connection to a modular telephone by means of an adapter telephone line having an RJ-11 modular plug on each end.

Figure 10:
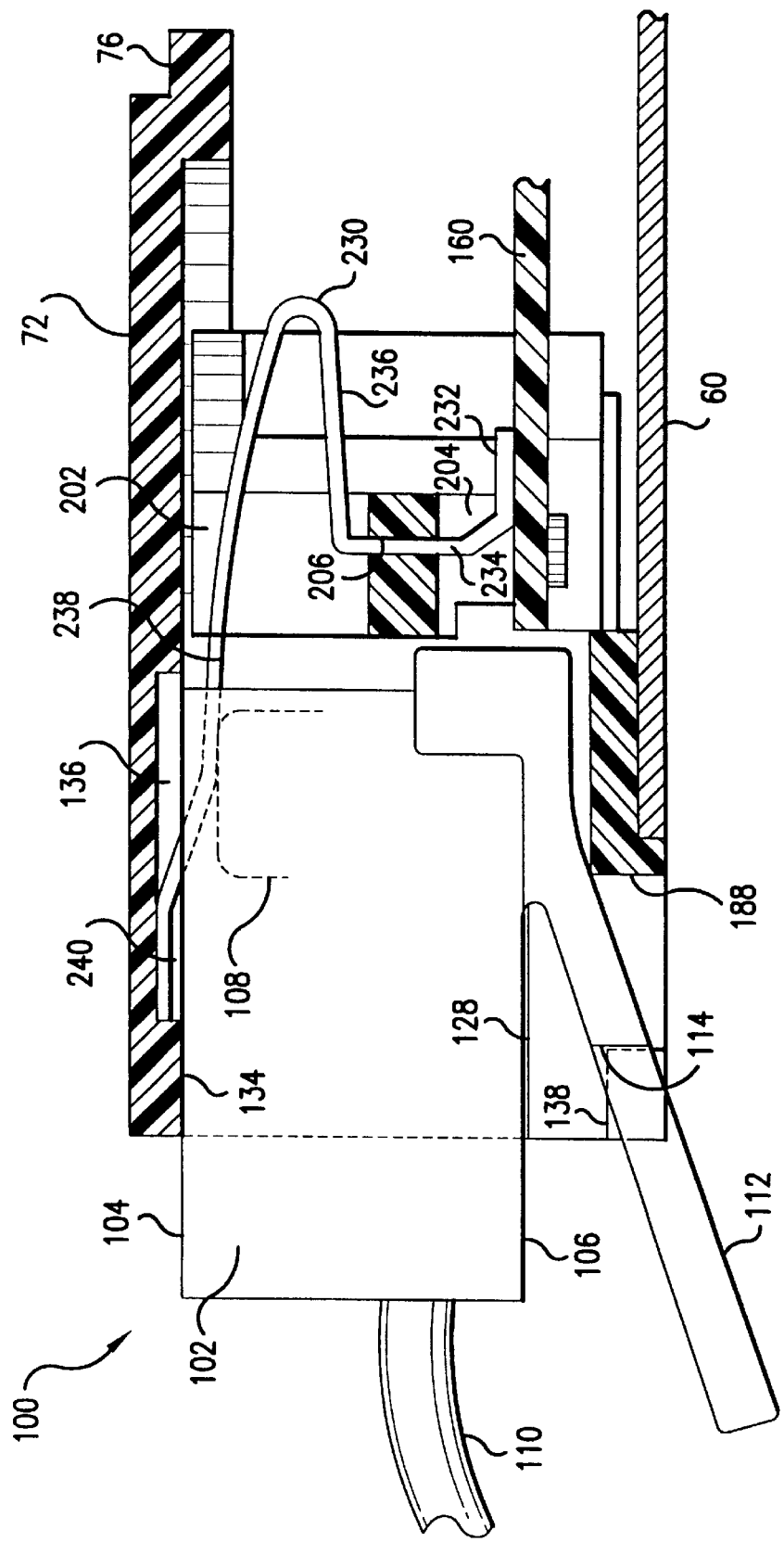
FIG. 10 is a side elevation view, in cross section, similar to FIG. 9, showing an RJ-type modular plug inserted in its associated receptacle.

By way of example, a conventional RJ-11 modular plug 100 for insertion in the receptacle 82 is shown in FIGS. 1 and 10. As is well known, the modular plug 100 includes a main rectangular body 102 having parallel top and bottom faces 104 and 106 and contact pins 108 connected to a multiconductor telephone cable 110 whose other end (not shown) has an identical RJ-11 modular plug. The standard plug 100 also includes a spring retention clip 112 having bilateral, transverse abutment surfaces 114.

The sizes and configurations of the receptacles 82, 84 and 86 are identical except that, as already noted, the width of the receptacle 86, which receives an RJ-45 modular plug, is greater than that of the receptacles 82 and 84 which each receive an RJ-11 plug. Accordingly, taking the receptacle 82 as typical of the three RJ receptacles of the preferred embodiment, the receptacle 82, which is defined by side walls 90 and 92 and top wall 98, has a modular plug access opening 120 along the rear end surface 18 of the card and an open or cutout bottom 122 having a T-shaped configuration. The side walls 90 and 92, at their lower ends, include inwardly directed flanges 124 and 126 defining ledges 128 and 130, respectively. The ledges 128 and 130, in conjunction with the top wall 98, define a channel 132 for receiving the main body 102 of the modular plug 100. The top wall 98 has an interior horizontal surface 134 including a plurality (six, in the case of receptacle 82) of uniformly spaced-apart, longitudinally extending grooves 136 for receiving the end portions of contact wires, as will be described below.

Figure 14:
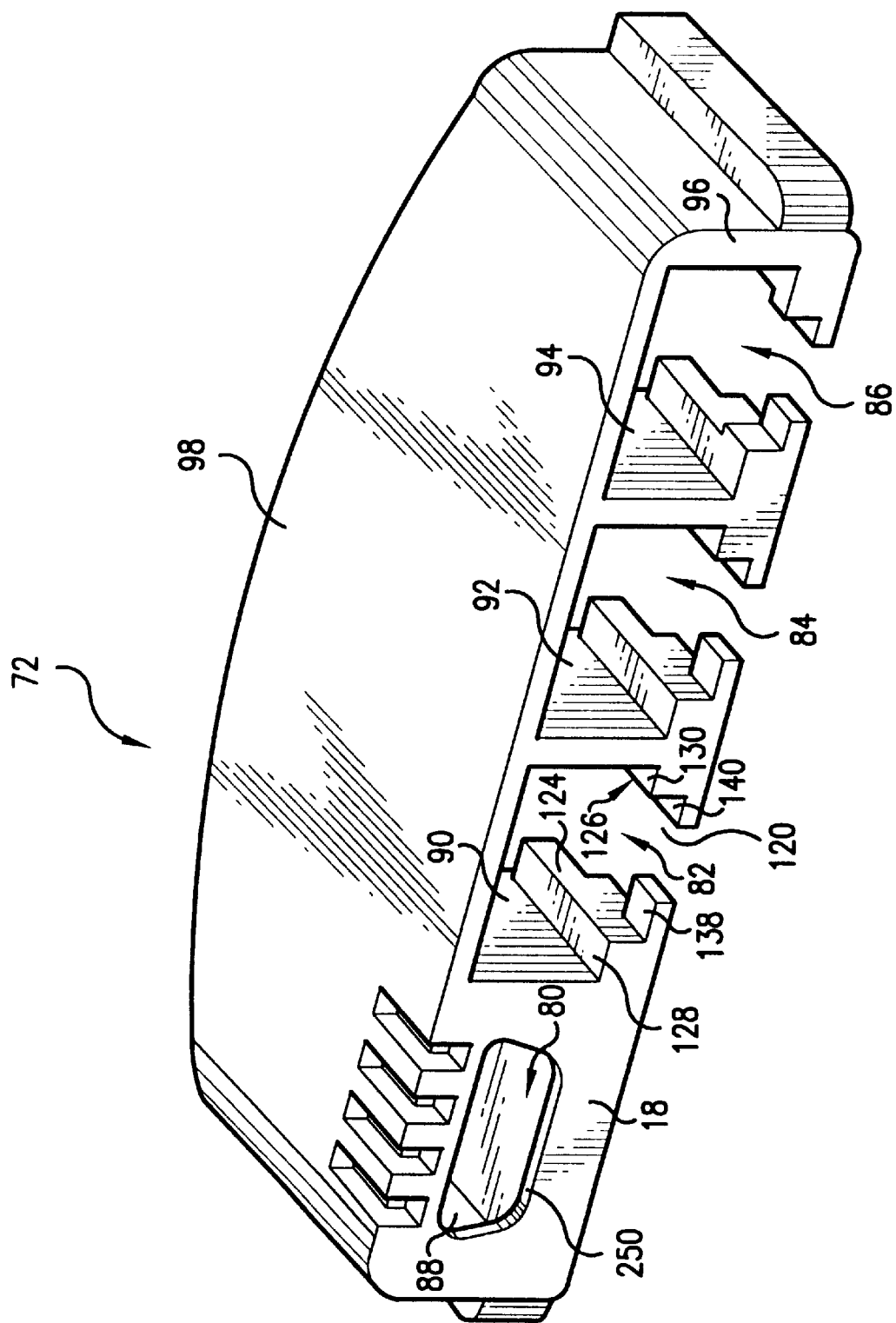
FIG. 14 is a perspective view of a specific embodiment of a receptacle body that may be utilized in the present invention.
Figure 15:
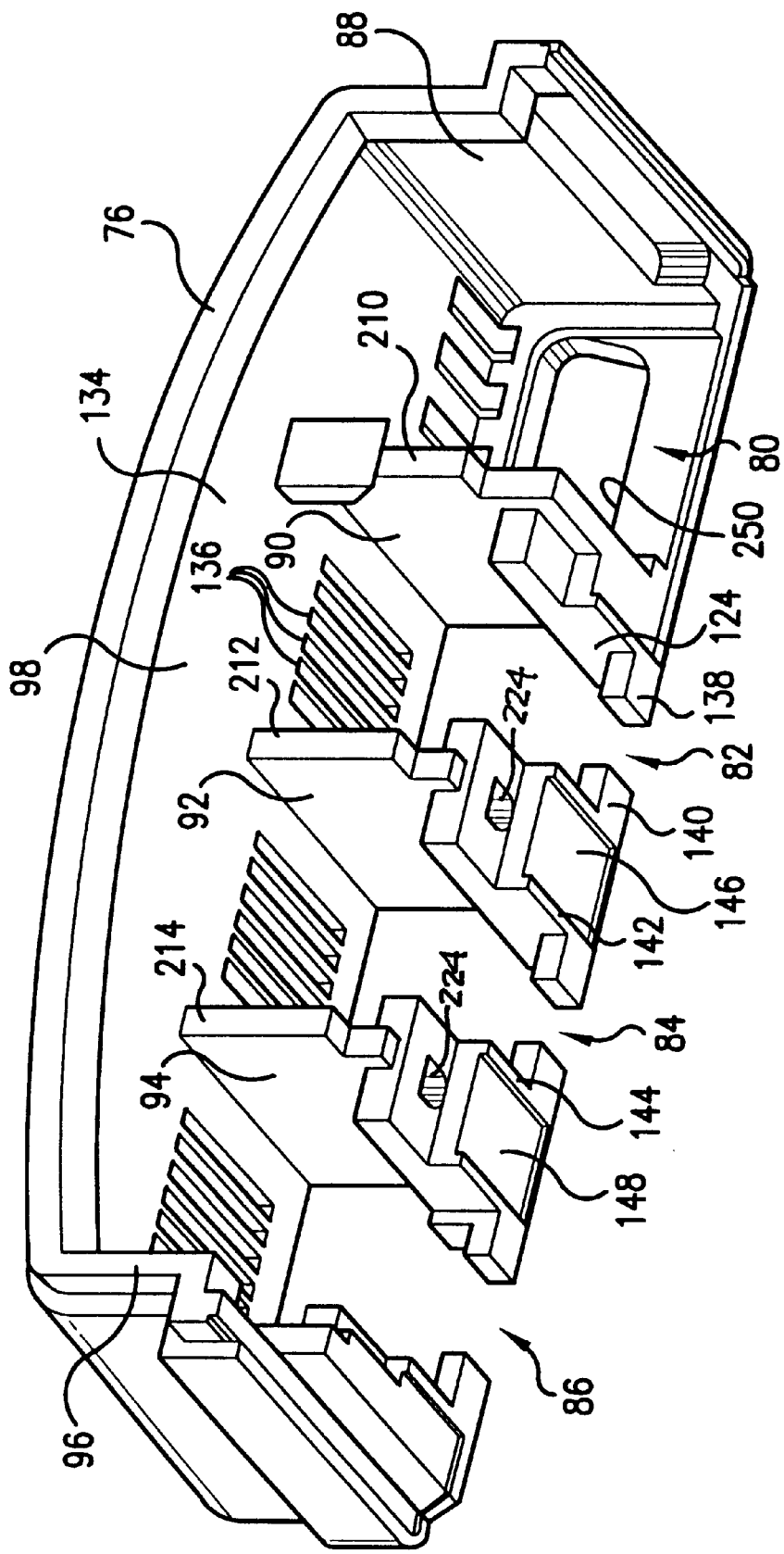
FIG. 15 is a another perspective view of the receptacle body shown in FIG. 14.

The representative receptacle 82 further includes an integrally molded pair of lugs 138 and 140 projecting inwardly from the flanges 124 and 126, respectively. As seen in FIGS. 14 and 15, for example, the inwardly directed flanges 124 and 126, together with the lugs 138 and 140, define the T-shaped opening or cutout 122 in the bottom of the receptacle 82. The lugs 138 and 140 are positioned for engagement by the abutment surfaces 114 on the retention clip 112 of the associated RJ modular plug 100. Thus, in a well known fashion, the abutment surfaces 114 on the retention clip 112 interact with the lugs 138 and 140 to lock the modular plug 100 into the receptacle 82 when the plug 100 is fully inserted, with the retention clip 112 projecting downwardly through the bottom opening 122 as best seen in FIG. 10. To minimize the depth of the receptacle 82, the lugs 138 and 140 are positioned at the rear extremity of the receptacle immediately adjacent the plug access opening 120.

With reference to FIG. 15, the walls 92 and 94 include lower surfaces 142 and 144, respectively, defining recesses 146 and 148 for receiving the tabs 64 along the rear margin 62 of the bottom cover panel 60.

Figure 11:
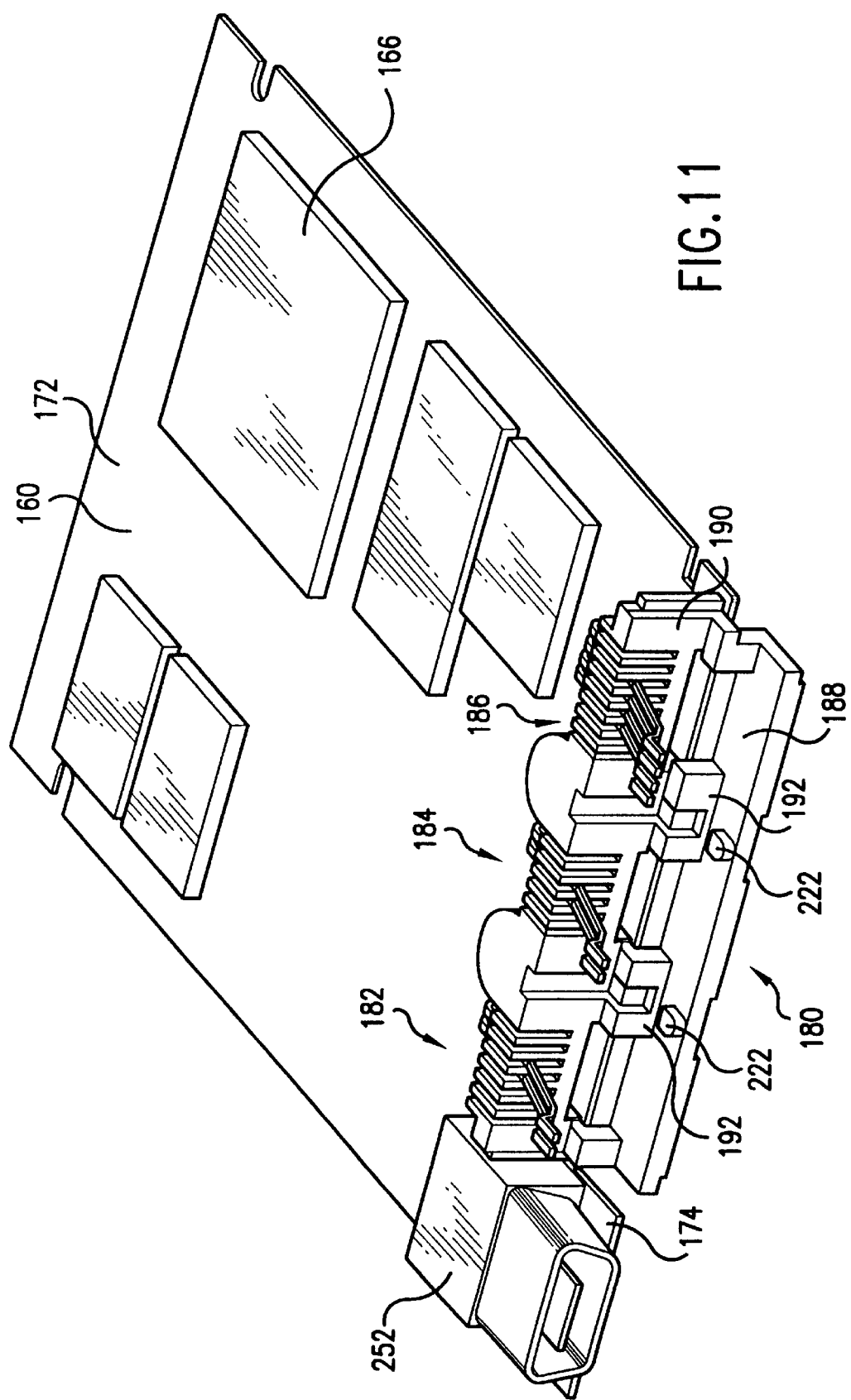
FIG. 11 is a perspective view of a subassembly of the device of FIG. 1, the subassembly including an electronic component substrate and a contact block and slim D-sub receptacle mounted along the rear margin of the substrate.

Disposed within the cavity 58 defined by the housing 50 is a substrate in the form of a printed circuit board assembly (PCBA) 160 having top and bottom surfaces 162 and 164 carrying integrated circuits and other electronic components, such as the components 166 shown schematically in FIGS. 7, 8 and 11. The PCBA 160 has longitudinal side margins 168 and 170 captured between the side walls 52 and 54 on the housing 50 and the flanges 62 and 64 of the bottom cover panel 60 (FIG. 8). As seen in FIG. 7, the card connector 34 is mounted along a forward margin 172 of the PCBA 160, the leads 42 from the connector 34 being soldered to a terminal section along the forward margin 172.

With reference to FIGS. 7 and 9–13, the PCBA 160 has a rear margin 174 along which is mounted a connector contact block 180 having three sections 182, 184 and 186 corresponding to the RJ connector receptacles 82, 84 and 86, respectively. The section 182 of the contact block 180 is representative of the RJ connector contact block sections. The contact block 180 may be supplied in tape and reel form and, using pick-and-place and surface mount technologies, connected to traces on the top surface 162 of the PCBA 160 along the rear margin 174 thereof (FIG. 11).

The contact block 180, preferably molded from plastic as a single piece, comprises a rearwardly projecting base 188, a transverse vertical wall 190, and posts 192 joining the base 188 and wall 190. The base 188 has a lower planar, recessed surface 194 to which the rear margin 62 of the bottom cover panel 60 is bonded. The vertical wall 190 of the contact block 180 has a lower extremity comprising a planar, horizontal PCBA abutment surface 196 engaged by and bonded to the upper surface of the rear margin 174 of the PCBA 160. Locating pins 198 projecting from the abutment surface 196 are received by corresponding holes 200 in the PCBA 160 and serve to precisely position the contact block 180 relative to the PCBA. The portion of the wall 190 corresponding to representative section 182 of the contact block 180 has an upper part including a plurality of parallel, longitudinally oriented, equally spaced apart, contact wire guide slots 202. Generally, the portions of the wall 190 of the contact block sections 182 and 186 associated with the RJ-11 receptacles are provided with six (6) slots to accommodate up to as many contact wires, while the portion of the wall associated with the RJ-45 receptacle has eight (8) slots. Below the slots 202 is a recess 204 extending upwardly from the PCBA abutment surface 196. Each slot 202 communicates with the associated recess 204 via a vertical contact wire retention aperture 206.

As best seen in FIG. 15, the receptacle body vertical walls 90, 92 and 94 have front edges 210, 212 and 214 configured to be closely received by notches 216, 218 and 220 in the wall 190 and posts 192. Further, the base 188 of the contact block 180 has a pair of upstanding projections 222 adapted to be received by apertures 224 in the receptacle body 72.

Figure 9:
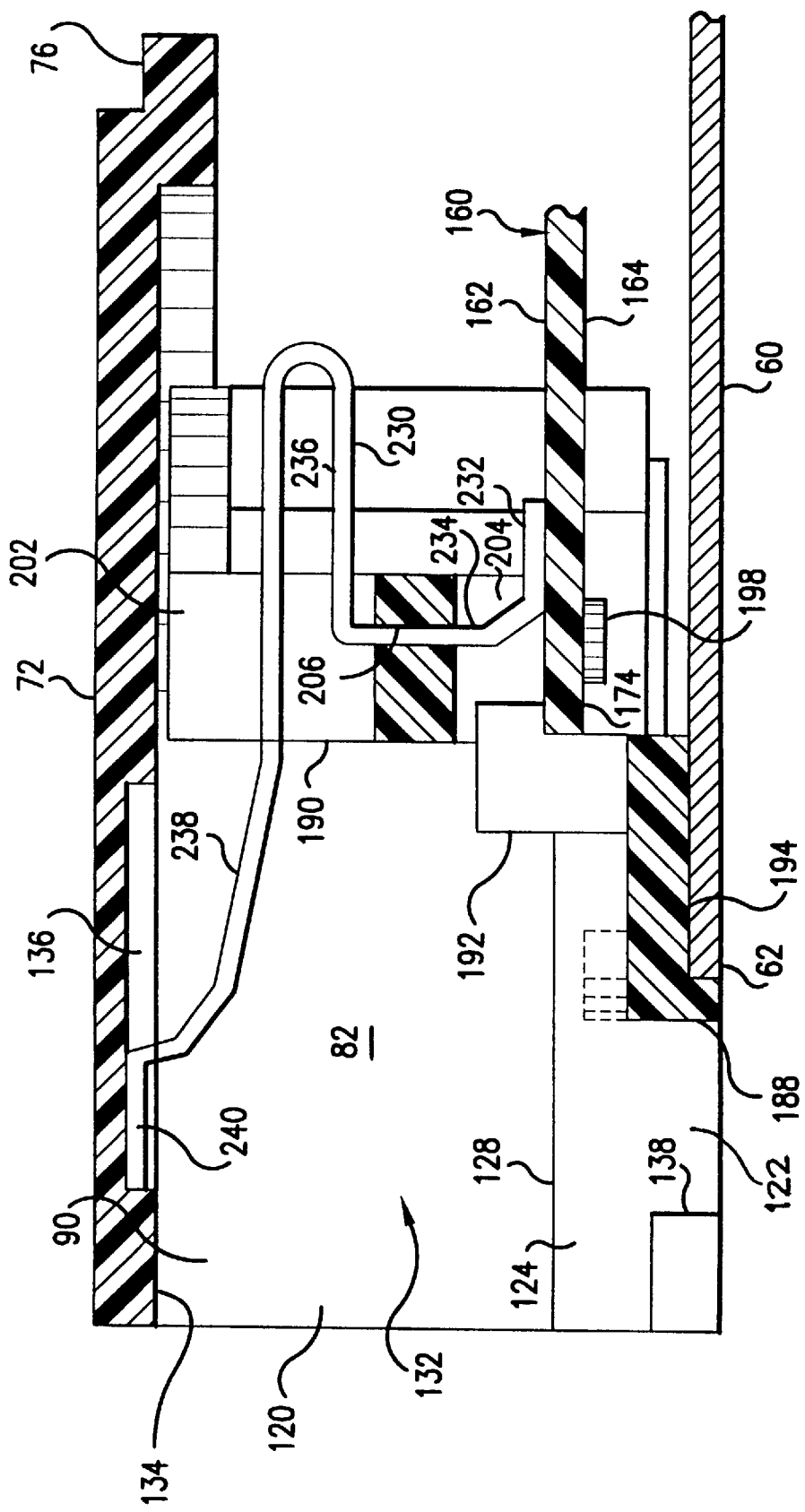
FIG. 9 is a side elevation view, in cross section, of the rear portion of the device of FIG. 1, as seen along the line 9—9 in FIG. 6, showing details of one of the RJ-type connector receptacles and an associated contact block.

When the receptacle body 72 and the contact block 180 are in their final, assembled configuration (FIG. 12), the slots 202 in the contact block wall 190 and the grooves 136 in the interior surface 134 of the top wall 98 of the receptacle body 72 are in longitudinal alignment. Thus, generally speaking, there will be a corresponding groove 136 for each slot 202. Each contact block section 182, 184 and 186 carries a plurality of contact wires. For example, the representative section 182 carries contact wires 230 each comprising a horizontal solder tail 232 soldered to a trace along the upper surface of the rear margin 174 of the PCBA 160; a vertical run 234 extending through one of the contact wire retention apertures 206 into a corresponding slot 202; and a horizontal portion 236 extending forwardly from the slot 202. A terminal portion 238 of the contact wire 230 is bent rearwardly as best seen in FIGS. 9, 10 and 13 from the horizontal portion 236 to form an angled spring biased contact for engagement by a corresponding contact pin 108 on the associated RJ modular plug 100, all as well known in the art. A rear extremity 240 of each contact wire 230 is captured by the corresponding groove 136 in the top wall 98 of the receptacle body 72 to stabilize its position and prevent damage to it upon insertion of the modular plug 100.

Figure 12:
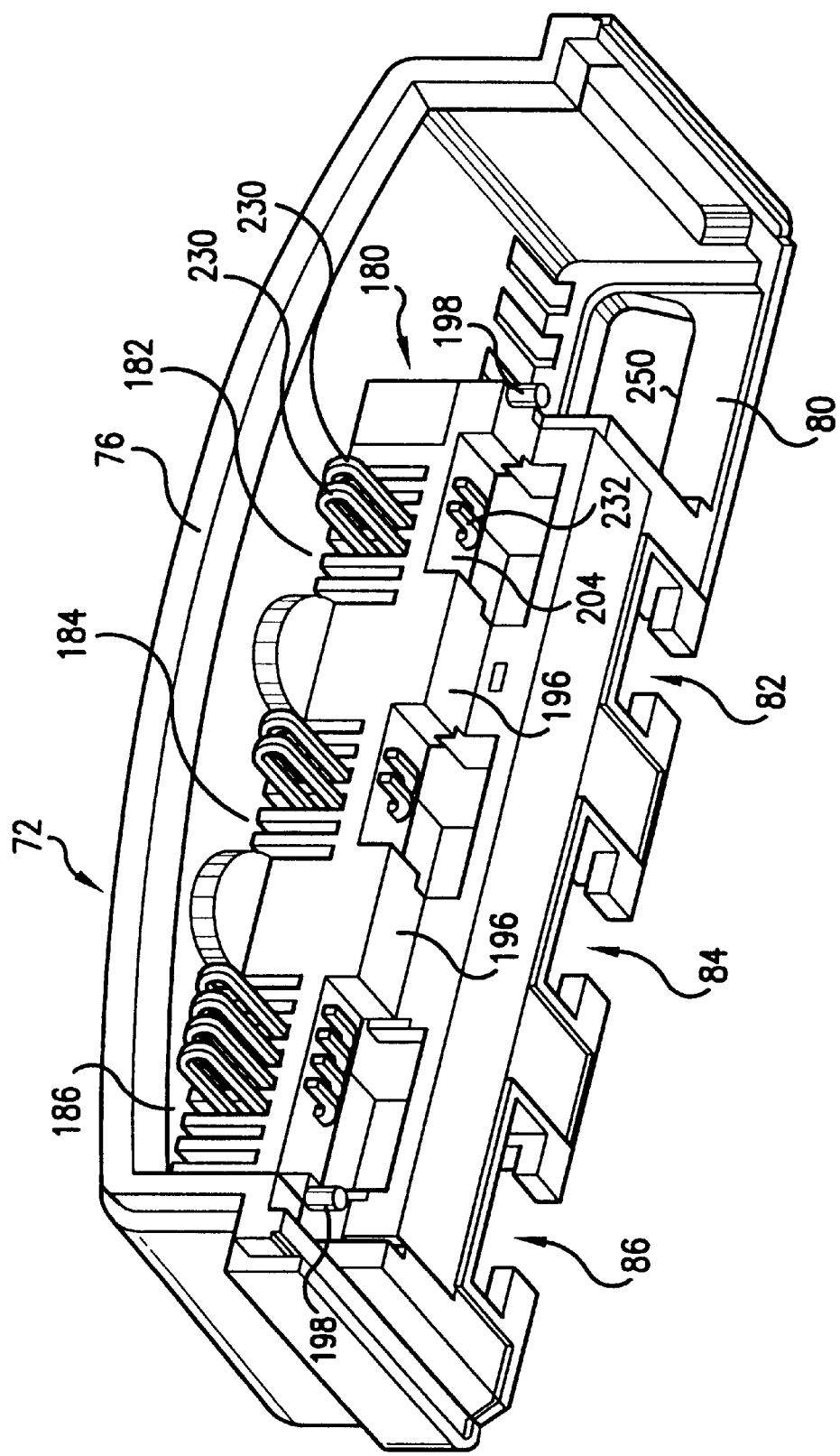
FIG. 12 is a perspective view of a subassembly of the device of FIG. 1, the illustrated subassembly comprising a receptacle body and mating contact block.
Figure 13:
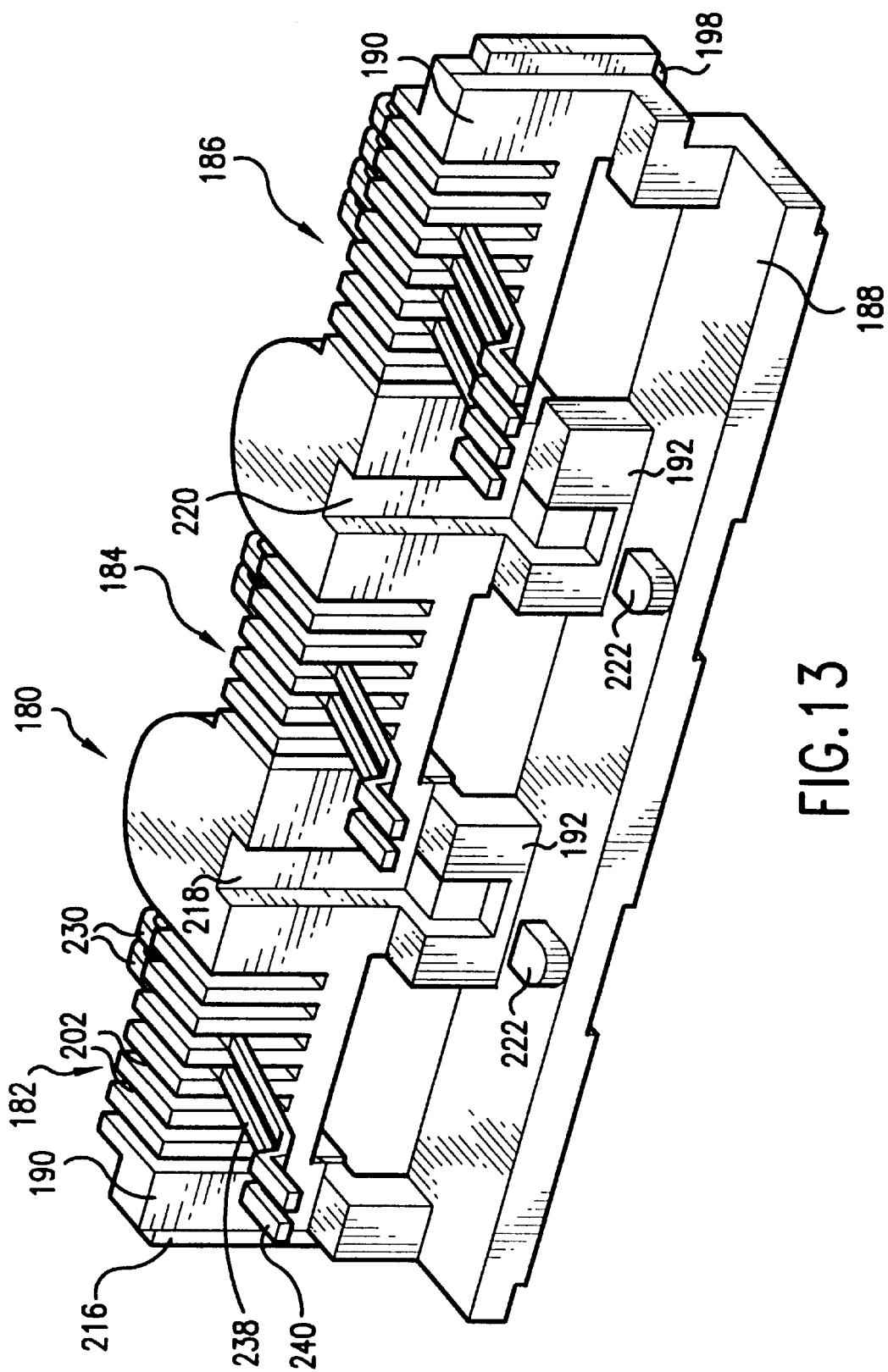
FIG. 13 is a perspective view of a specific embodiment of a contact block that may be utilized in the present invention.

As best seen in FIGS. 9, 10 and 12, the contact block 180 is designed to minimize its encroachment on the adjacent printed circuit board assembly 160. Thus, the forwardly extending solder tail 232 of each contact wire 230 is contained substantially within the longitudinal confines of the recess 204 and is connected to the traces on the rear margin 174 of the PCBA 160 as close as practicable to the rear edge of the PCBA. After fabrication of the subassembly shown in FIG. 11, the recesses 204 facilitate inspection of the integrity of the solder joints connecting the contact wire tails 232 to the PCBA and provide sufficient space to permit resoldering if necessary. Compact design is also afforded by bending the wire 230 forwardly to form the horizontal wire portion 236 and then rearwardly at an appropriate angle to provide a sufficiently long and therefore compliant rearwardly extending terminal portion 238. It will be seen that the portions of the contact wire 230 forward of the contact block 180 do not interfere with the PCBA or any of the devices carried thereby.

The rear end 18 of the card 10 also includes an opening 250 configured to receive a slim D-sub plug for coupling the host system 12 to a cellular telephone permitting wireless communications. A mating slim D-sub connector body 252, positioned to receive the slim D-sub plug, is mounted on the rear margin 174 of the PCBA adjacent the contact block in alignment with the opening 250.

It will thus be seen that the present invention successfully unites standard connectors and particularly RJ-type modular connectors, with the standard Type III PCMCIA card architecture without violating the constraints of either standard. Further, by providing an open bottom in the receptacle, the retention clip, in the fully inserted position of the modular plus is permitted to project outwardly from the lower, horizontal outer surface of the card. Accordingly, the 10.5 mm height of the Type III card can incorporate a receptacle conforming to the FCC RJ connector standards. At the same time, by placing the lugs at the rear extremity of the receptacle, the depth of the receptacle has been minimized, extending longitudinally, at most approximately 12 mm, so that encroachment on adjacent PCBA space is minimized.

It will be evident that although it is preferable to orient the receptacles so as to receive the associated plugs in a longitudinal insertion direction, the orientation of the receptacles can be varied so as to receive the mating plugs in a direction that departs from longitudinal to some extent, so long as the upper and lower faces of the plug are maintained substantially parallel with the upper and lower exterior surfaces of the receptacle-defining, rear portion of the device.

It further will be obvious that the receptacle body may be provided with various connector receptacle combinations besides the illustrated combination comprising an RJ-11 modem receptacle, an RJ-45 Ethernet receptacle, an RJ-11 pass-through and a slim D-sub connector receptacle. Alternatively, by way of example, the receptacle body could include an RJ-11 modem and pass-through receptacles; or a LAN RJ-45 receptacle only; and so forth.

Further, the receptacle body can be adapted to connect the card to any one or more of a plurality of data or information transfer systems, U.S. and/or foreign. Thus, by way of example and not limitation, FIG. 16 shows a receptacle body 260 incorporating a mini-DIN connector receptacle 262; FIG. 17 depicts a receptacle body 264 housing a BNC/coax connector 266; FIG. 18 shows a receptacle body 268 supporting a D-sub connector 270; and FIG. 19 shows a receptacle body 272 including a USB (Universal Serial Bus) or IEEE-1394 connector 274. A particular receptacle body may thus incorporate any one or a combination of the standard connectors shown or other standard connectors of the many types known in the relevant industries, all within the Type III card form factor and particularly the 10.5 mm height limitation.

It will also be seen that the combination of the plastic housing and bottom cover panel together define a frameless card enclosure thereby maximizing the usable PCBA surface area.

While the present invention has been described with reference to particular illustrative embodiments, the invention is not intended to be restricted to those embodiments but only by the appended claims. It will be appreciated that those skilled in the art can change or modify the described embodiments, or substitute equivalents for the various elements described and shown, without departing from the scope and spirit of the invention. For example, it will be evident that the critical dimension is the cross section of the card, which cross section should not exceed the PCMCIA standards. The card length could be made somewhat longer than the PCMCIA card length of 85.0 mm although this is less desirable since additional length might project excessively from the host system.

What is claimed is:

1. A device for use in a host system having a PCMCIA Type III standard slot, the device being adapted to connect the host system to an information transfer system, the device comprising:

a housing having longitudinal sides, a transverse front end and a rear portion, at least the rear portion of the housing having a thickness conforming substantially to the PCMCIA Type III standard;

a substrate enclosed within the housing, the substrate carrying circuit elements and including a rear margin within the rear portion of the housing;

a connector at the front end of the housing connected to circuit elements on the substrate and adapted to be received by a corresponding connector within the slot of the host system;

a contact block mounted on the rear margin of the substrate, the contact block having an overall height within the thickness confines of the rear portion of the housing, the contact block having a plurality of contact wire sections, each section being adapted to carry a plurality of contact wires; and at least one forwardly extending receptacle defined by the rear portion of the housing, the at least one receptacle being sized and configured to receive an RJ-type standard connector plug including a plurality of contacts, the at least one receptacle being operatively associated with one of the contact wire sections of the contact block, at least the one contact wire section carrying a plurality of contact wires, each of said contact wires having a first portion connected to circuit elements on the substrate, and a second portion extending into the at least one receptacle, the second portion of each contact wire being shaped and positioned for engagement with a corresponding contact on the connector plug, the contacts on the plug being adapted to engage the second portions of the contact wires in the at least one receptacle when the plug is inserted in the receptacle, wherein the device is adapted to be directly connectable to the information transfer system utilizing the standard connector plug.

2. A device, as defined in claim 1, in which:

the housing has a transverse rear end and the device has an overall length extending between the transverse front and rear ends, said overall length conforming to the PCMCIA length standard.

3. A device, as defined in claim 1, in which:

the contact block comprises a one-piece structure.

4. A device, as defined in claim 1, in which:

the device includes a plurality of receptacles equal in number to the plurality of contact wire sections on the contact block, each of the plurality of receptacles being operatively associated with one of the plurality of contact wire sections, each of the contact wire sections carrying a plurality of contact wires, each of said contact wires having a first portion connected to circuit elements on the substrate, and a second portion extending into the corresponding receptacle, the second portion of each contact wire being shaped and positioned for engagement with a corresponding contact on the connector plug.

5. A device, as defined in claim 4, in which:

each receptacle is sized and configured to receive an RJ-type standard connector plug.

6. A device, as defined in claim 5, in which:

at least one of the receptacles is sized and configured to receive an RJ-11 connector plug.

7. A device, as defined in claim 5, in which:

at least one of the receptacles is sized and configured to receive an RJ-45 connector plug.

8. A device, as defined in claim 1, in which:

the second portion of each of said contact wires includes an end; and the at least one receptacle has a top wall having an interior surface, the interior surface including a plurality of longitudinally extending grooves, each of said grooves receiving the end of one of the contact wires.

9. A device, as defined in claim 8, in which:

each contact wire section of the contact block includes a plurality of longitudinally extending slots, each of said slots being in longitudinal alignment with a corresponding groove in the interior surface of the top wall of the at least one receptacle.

10. A device for use in a host system having a PCMCIA Type III standard slot, the device being adapted to connect the host system to an information transfer system, the device comprising:

a housing having longitudinal sides, a transverse front end and a rear portion, at least the rear portion of the housing having a thickness conforming substantially to the PCMCIA Type III standard;

a substrate enclosed within the housing, the substrate having a top surface and carrying circuit elements, the substrate including a rear margin disposed within the rear portion of the housing;

a connector at the front end of the housing connected to circuit elements on the substrate and adapted to be received by a corresponding connector within the slot of the host system;

at least one forwardly extending receptacle defined by the rear portion of the housing, the at least one receptacle including a top wall and being sized and configured to receive a standard RJ-type plug for directly connecting the device to the information transfer system, the plug including contacts; and a contact block mounted on the substrate along the rear margin thereof, the contact block having an overall height contained within the thickness confines of the rear portion of the housing, the contact block including a portion extending between the top surface of the substrate and the top wall of the at least one receptacle, said portion of the contact block carrying a plurality of contact wires, each of said contact wires having a first portion connected to circuit elements carried by the substrate, and a second portion extending into the at least one receptacle adjacent the top wall thereof, the second portion of the contact wire being shaped and positioned for engagement with a corresponding contact on a standard RJ-type plug.

11. A device, as defined in claim 10, in which the contact block comprises:

a base; and wherein said portion of the contact block comprises a wall mounted on the base, the wall having a substrate-engaging surface, a plurality of spaced apart, parallel slots, and a recess extending from the substrate-engaging surface, each slot communicating with the recess through a contact wire retention aperture; and a plurality of contact wires carried by the contact block, each of the contact wires being carried by one of said retention apertures, said first portion of each of the contact wires extending into the recess and said second portion of each of the contact wires extending from one of the slots in the wall of the contact block for engagement by a corresponding contact on the standard RJ-type plug.

12. A device, as defined in claim 10, in which:

the top surface of the substrate including conductive traces thereon connected to said circuit elements, the first portion of each of said contact wires including a horizontally extending solder tail connected to a conductive trace on the top surface of the substrate along the rear margin thereof.

13. A device, as defined in claim 12, in which:

the contact block defines a recess overlying the rear margin of the substrate, the horizontally extending solder tail of each of said contact wires being disposed at least in part within the confines of the recess.

14. A device, as defined in claim 10, in which the housing includes:

a top wall and longitudinal, parallel side walls depending from the top wall, the longitudinal side walls and top wall defining an internal cavity for receiving the substrate; and a bottom sheet metal cover panel enclosing the cavity, the bottom sheet metal cover panel including parallel, upwardly extending side flanges configured to nest within the side walls of the housing.

15. A device, as defined in claim 14, in which:

the side walls of the housing and the upwardly extending side flanges of the bottom cover panel are adapted to receive and retain the substrate between them.

\* \* \* \* \*